(12) United States Patent
Binder et al.

(10) Patent No.: US 11,072,850 B2
(45) Date of Patent: Jul. 27, 2021

(54) PROCESS FOR COATING A CONDUCTIVE COMPONENT AND CONDUCTIVE COMPONENT COATING

(71) Applicant: Universidade Federal De Santa Catarina, Florianopolis (BR)

(72) Inventors: Cristiano Binder, Florianopolis (BR); Aloisio Nelmo Klein, Florianopolis (BR); Kaline Pagnan Furlan, Florianopolis (BR); Pedro Henrique Teshima Shioga, Florianopolis (BR); Renan Oss Giacomelli, Florianopolis (BR); Roberto Binder, Joinville (BR)

(73) Assignee: UNIVERSIDADE FEDERAL DE SANTA CATARINA, Florianopolis (BR)

( * ) Notice: Subject to any disclaimer, the term of this patent is extended or adjusted under 35 U.S.C. 154(b) by 95 days.

(21) Appl. No.: 15/653,587

(22) Filed: Jul. 19, 2017

(65) Prior Publication Data

US 2018/0023187 A1    Jan. 25, 2018

(30) Foreign Application Priority Data

Jul. 19, 2016    (BR) .................. 10 2016 016715 9

(51) Int. Cl.
| | |
|---|---|
| *C23C 14/00* | (2006.01) |
| *C23C 14/32* | (2006.01) |
| *C23C 28/04* | (2006.01) |
| *C23C 28/02* | (2006.01) |
| *C23C 16/02* | (2006.01) |

(Continued)

(52) U.S. Cl.
CPC ............. *C23C 14/32* (2013.01); *C23C 8/20* (2013.01); *C23C 8/24* (2013.01); *C23C 8/30* (2013.01); *C23C 14/022* (2013.01); *C23C 14/0605* (2013.01); *C23C 16/0272* (2013.01); *C23C 16/26* (2013.01); *C23C 28/00* (2013.01); *C23C 28/021* (2013.01); *C23C 28/023* (2013.01); *C23C 28/046* (2013.01);
(Continued)

(58) Field of Classification Search
CPC ......... C23C 14/00; C23C 16/00; C23C 28/00; C23C 8/00; H01J 37/00; H01J 2237/00
See application file for complete search history.

(56) References Cited

U.S. PATENT DOCUMENTS 6,228,471 B1 * 5/2001 Neerinck ............... A61L 27/303
    428/216
6,328,857 B1 * 12/2001 Anzaki ............... C23C 14/3464
    204/192.12

(Continued)

FOREIGN PATENT DOCUMENTS

BR        PI0803774 A2    3/2010
WO    Wo 2009/149526 A1  12/2009

*Primary Examiner* — David P Turocy
*Assistant Examiner* — Mohammad Mayy
(74) *Attorney, Agent, or Firm* — Foley & Lardner LLP

(57) ABSTRACT

The present invention describes a process for coating conductive component in a plasma reactor and a conductive component coating, wherein the process includes the steps of cleaning, mechanical support deposition, topographic modification by plasma bombardment, chemical support layer deposition and amorphous carbon layer deposition (Diamond-Like Carbon). In one embodiment, the process is in single cycle. The present invention pertains to the fields of Materials Engineering, Physics and Chemistry.

3 Claims, 2 Drawing Sheets

Amorphous carbon film

Chemical support layer

Mechanical support layer

Substrate

(51) Int. Cl.
*C23C 28/00* (2006.01)
*C23C 16/26* (2006.01)
*C23C 8/20* (2006.01)
*C23C 8/24* (2006.01)
*H01J 37/32* (2006.01)
*C23C 8/30* (2006.01)
*C23C 14/02* (2006.01)
*C23C 14/06* (2006.01)
*H01J 37/36* (2006.01)

(52) U.S. Cl.
CPC ........ *H01J 37/32862* (2013.01); *H01J 37/36* (2013.01); *H01J 2237/332* (2013.01)

(56) References Cited

U.S. PATENT DOCUMENTS

| | | | | |
|---|---|---|---|---|
| 2002/0032073 | A1* | 3/2002 | Rogers | C23C 16/458 473/324 |
| 2012/0088701 | A1* | 4/2012 | Suzuki | C23C 16/0272 508/109 |
| 2013/0059093 | A1* | 3/2013 | Suzuki | C23C 16/26 427/578 |
| 2014/0099451 | A1* | 4/2014 | Mahieu | C23C 16/402 427/576 |

* cited by examiner

PROCESS FOR COATING A CONDUCTIVE COMPONENT AND CONDUCTIVE COMPONENT COATING

FIELD OF THE INVENTION

The present invention describes a process for coating a conductive component in a plasma reactor and a conductive component coating, wherein the process comprises the steps of cleaning, mechanical support deposition, topographic modification by plasma bombardment, chemical support layer deposition and amorphous carbon layer deposition (Diamond-Like Carbon). The present invention pertains to the fields of Materials Engineering, Physics and Chemistry.

BACKGROUND OF THE INVENTION

Diamond-like carbon (DLC) films are carbon-based films, generally amorphous, that have a diamond-like structure, not having, however, the binding angles that exists in the tetrahedral structure thereof, but rather $sp^2$ and $sp^3$ bindings and, further, a certain amount of hydrogen. The ratio between $sp^3$ and $sp^2$ bonds influences the features, thus, defining the type of film. Usually a higher ratio indicates properties closer to the diamond (for example, greater hardness), while a lower ratio indicates films considered more graphitic, that is, having properties similar to those of graphite (FIG. 1).

In recent years these films have attracted special attention mainly due to properties such as: the ability to provide low coefficient of friction, high chemical stability, high hardness, optical transparency, high electrical resistivity and low electronic affinity. In this way, they can be used in a wide range of applications, among them optoelectronic devices, coatings with tribological or chemical applications, automotive parts, mold coatings and biocompatible parts.

One of the most interesting properties of amorphous carbon films is having the ability to provide a low coefficient of friction, combined with a high abrasion resistance, otherwise, the film would be rapidly abraded. Through the use of amorphous carbon films, between the metal-metal contact, it is possible to achieve coefficients of friction lower than 0.2, reaching very low levels of 0.01 in high vacuum and reducing the wear rate to levels of $10^{-10}$ mm$^3$/Nm.

Among the techniques most used to produce amorphous or non-amorphous carbon films are pulsed laser deposition (PLD), plasma assisted (or enhanced) chemical vapor deposition (PA-CVD or PE-CVD), ion beam sputtering (IBS), ion beam assisted deposition (IBAD), plasma immersion (or source) ion implantation (PIII or PSII). In these techniques, the ions are used to deposit or to implant elements in the desired substrate, that can be of quartz, silicon, steel and its alloys, aluminum and its alloys, tungsten and its alloys, among others. The way in which the ions are implanted or deposited has a great influence on the structure and, consequently, on the properties of the formed films.

Among the disadvantages of the aforementioned processes are: the need for cleaning or etching of the surface to be deposited with highly toxic chemical solvents or reagents; creation of the mechanical support layer through a process that is separate from the deposition process of the carbon film, requiring the removal of the pieces of the bath (electrochemical), furnace (pyrolysis) or reactor (deposition), exposing the surface that will receive the carbon film to a different atmosphere, this surface being therefore altered; geometric constraints of the component; and difficulty of scheduling the process.

Document BRPI0803774A2 (WO2009149526A8) discloses the improvement of a possible thermochemical treatment type, nitriding, by performing the cleaning process together with the nitriding process, basically altering the switching of the plasma source between one step and another, which eliminates the disadvantage of exposing the surface of the workpiece to a different atmosphere prior to the deposition of the carbon film and confers increased productivity.

BRIEF DESCRIPTION OF THE INVENTION

Thus, the present invention comes to solve the problems present in the prior art, from a process for coating a conductive component in a plasma reactor, wherein the process comprises the steps of cleaning, mechanical support deposition, topographic modification by plasma bombardment, chemical support layer deposition and amorphous carbon layer deposition (Diamond-Like Carbon).

In a first object, the present invention provides a process for coating a conductive component, wherein the conductive component is in contact with a support capable of undergoing polarity inversions, within a plasma reactor, comprising the steps of:

a) Cleaning of the surface of the conductive component by electron bombardment, wherein the gases in the plasma atmosphere are selected from the group consisting of hydrogen, oxygen, argon, nitrogen or a combination thereof, in a temperature range between 20 and 300° C. and a working pressure between 0.1 and 10 Torr, with positive potential support;

b) Mechanical support deposition in the conductive component comprising gas ion bombardment selected from a combination of two or more gases of the group: hydrogen, oxygen, argon, nitrogen, methane, acetylene, or other ionizable hydrocarbon gas, in a temperature range between 200 and 650° C., working pressure between 0.1 and 10 Torr and voltage between −200 and −1000 V applied to the conductor component support;

c) Topographic modification comprising gas ion bombardment selected from a combination of two or more gases of the group: hydrogen, oxygen, argon, nitrogen, methane, acetylene, or other ionizable hydrocarbon gas, in a temperature range between 200 and 650° C., working pressure between 0.1 and 10 Torr and voltage between −200 and −1000 V applied to the conductor component support;

d) Deposition of the chemical support layer in the conducting component, by gas ion bombardment, wherein the gases are selected from the group consisting of gaseous or liquid precursors, containing elements with chemical affinity with the carbon, in a temperature range between 200 and 350° C., working pressure between 0.1 and 10 Torr, connected time of the plasma source between 75 and 90% of the time of a DC source pulse, which operates at a frequency of 50 to 150 kHz, and voltage between −300 and −1000 V applied to the conductor component support;

e) Deposition of amorphous carbon layer on the surface of the chemical support layer by gaseous hydrocarbon ions bombardment, wherein the gases in the plasma atmosphere are selected from the group consisting of at least one liquid precursor with at least one metal radical or the combination of such precursor with at least one ionizable hydrocarbon gas and generating ions which are deposited on the component, in a temperature range of 200 to 350° C., working pressure between 1 and 3 Torr, connected time of the plasma source between 75 and 90% at a frequency of 50 to 150 kHz and voltage between −300 and −1000 V applied to the conductive component support.

In a second object, the present invention features a conductive component coating, produced by said process for coating a conductive component, wherein the coating comprises:

at least a first mechanical support layer, in direct contact with the surface of the conductive component;

at least one chemical support layer, between the mechanical support layer and an amorphous carbon layer;

at least one amorphous carbon layer adhered to the chemical support layer.

Also, the inventive concept common to all claimed protection contexts is the process for coating a conductive component in a plasma reactor, wherein the process comprises the steps of cleaning, topographical modification by thermochemical treatment, chemical support layer deposition and amorphous carbon layer deposition (Diamond-Like Carbon).

These and other objects of the invention will be readily appreciated by those skilled in the art and by companies with interests in the segment, and will be described in sufficient detail for their reproduction in the following description.

BRIEF DESCRIPTION OF THE DRAWINGS

Hereinafter, the present invention will be described in more detail with the aid of the accompanying drawings, in which.

DETAILED DESCRIPTION OF THE INVENTION

In the present invention, a process for coating a conductive component in a plasma reactor, wherein the process comprises the steps of cleaning, mechanical layer deposition, topographic modification, chemical support layer deposition and amorphous carbon layer deposition (Diamond-Like Carbon) is revealed. The process is possible to be scaled, presents low cost in relation to other processes by plasma (industrial production) and allows to obtain films with high adhesion and improved tribological properties.

The present invention has, as one of its goals, the provision of a process, using a plasma reactor, to produce, without the need for further operations and without experiencing undesirable limitations in geometry, self-lubricating components due to the presence of a carbon film on its surface, by means of an efficient cleaning step, a construction of a suitable topography that favors adhesion of the subsequently deposited layer(s), by varying processing parameters, mainly type of gas, gas flow, connected time of the plasma source, voltage of the plasma source and inversion of the polarization of the support where the components are located.

The present document reports the production of carbon films through plasma assisted (or enhanced) chemical vapor deposition (PE-CVD) in a reactor, developed for this process, that can be carried out in a single cycle (without reactor opening, exchange of support, apparatus or parts). The process can be basically divided into: cleaning, mechanical support layer deposition, topographic modification, deposition of at least one interlayer (chemical support layer) and deposition of at least one layer of amorphous carbon. During the cycle, there are several parameters that can influence the structure and quality of the film, such as: type of gas used for cleaning, topographic modification and deposition (examples: argon, hydrogen, acetylene, methane, toluene), individual and total flow of gases, working pressure, plasma source voltage, connected time of the plasma source, time spent in each step, time of deposition, and the like.

Figure 1:
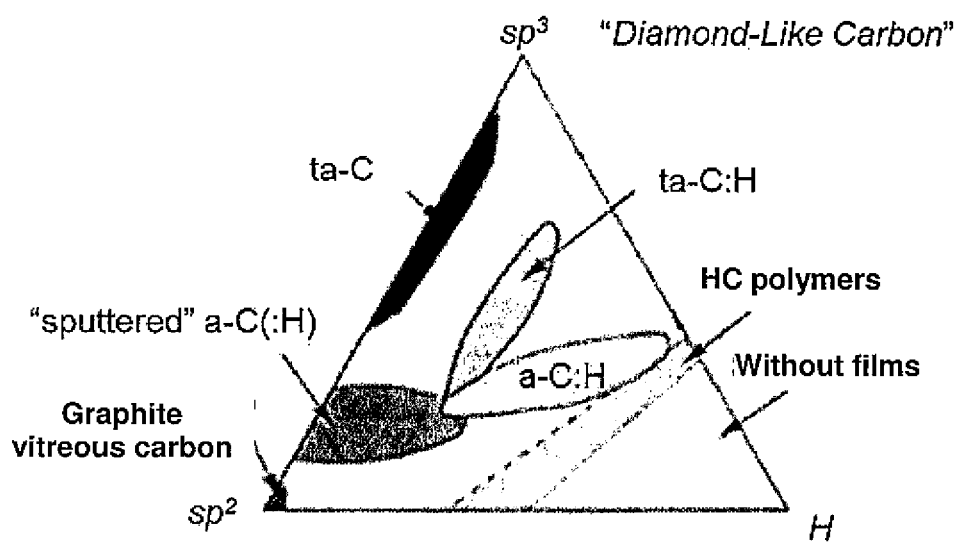
FIG. 1 illustrates a schematic of the ratios between the $sp^3$ and $sp^2$ bonds and their influence on the features of the film, where a-C:H=amorphous hydrogenated, ta-C=tetrahedral without hydrogen, ta-C:H=tetrahedral hydrogenated.
Figure 2:
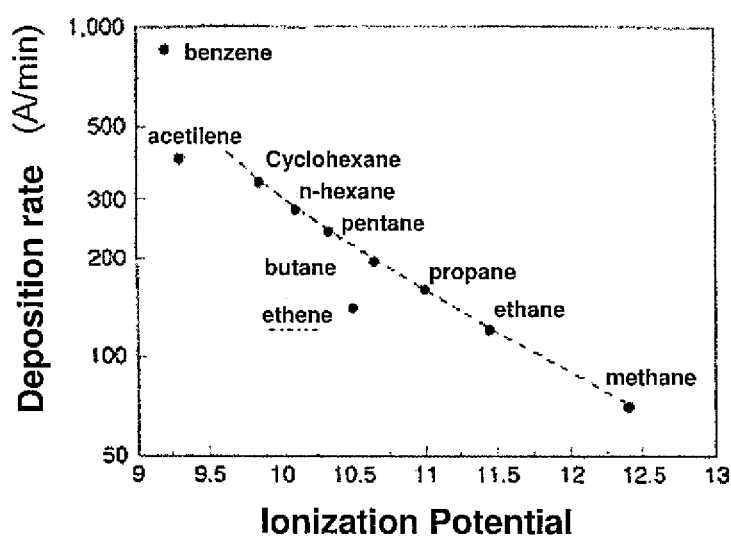
FIG. 2 illustrates a graphic and the influence of the hydrocarbon gas on the deposition rate of the amorphous carbon film.

Each of the possible steps of the process (mechanical support deposition, cleaning, topographic modification, interlayer deposition and carbon layer deposition) have specific parameters and even a small change can result in films with totally different properties. An increase in deposition time or in plasma source voltage during the deposition of an interlayer, for example, may result in a thicker interlayer, which will directly influence the adhesion properties of the deposited film, being that an excessively thick interlayer may come off the substrate completely during the cycle or with mechanical stresses of the component. Another important parameter is the type of gas used (carbon precursor gas) to generate the plasma during film deposition, which is already known in the literature (see FIG. 2). Carbon precursor gases are usually diluted in $H_2$ or Ar. The ratio of this dilution also has an influence on the features and properties of the formed film.

The tribological properties of the DLC films depend not only on the features of the film (hardness, adhesion, roughness, residual stresses) but also on the way the film is requested, including environmental factors and loading parameters. This means that the same DLC film may exhibit totally different properties when tested in dry nitrogen or in humid air, for example.

Figure 3:
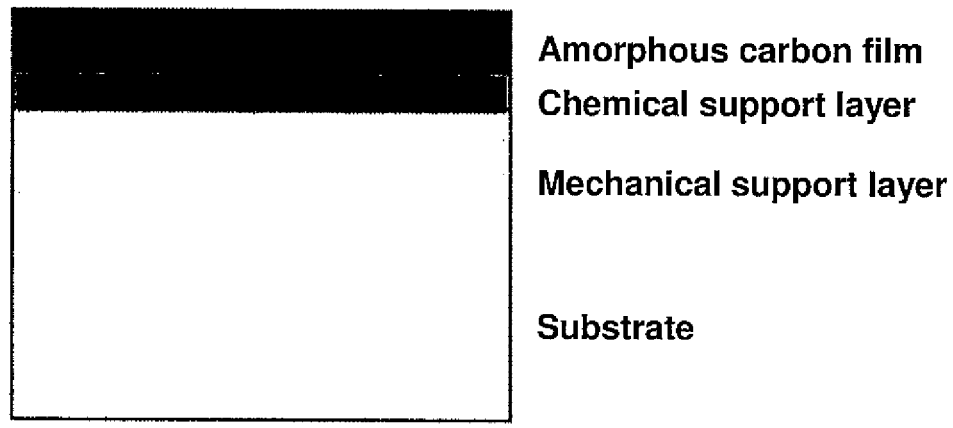
FIG. 3 illustrates a schematic of the multilayer system of an embodiment of the coating.

One of the properties that is affected by the processing parameters and has a direct influence on the tribological performance of the film is the adhesion of the carbon film to the substrate. In addition to the processing parameters mentioned above, it is directly linked to the type and surface properties of the substrate wherein the film will be deposited. It is known that DLC films, in general, have a better adhesion to silicon substrates than to steel. For the film to have a better adhesion it is necessary to increase the chemical affinity and reduce the incompatibility of properties between the film and the substrate, such as for example, the modulus of elasticity. This is generally done through the use of multilayer systems, also called interlayers, (see schematic drawing of FIG. 3), wherein the lower layer provides the mechanical support and the layer in direct contact with the film provides chemical adhesion.

In the present invention, the component to be coated must be an electrical conductor, that can be produced via different manufacturing processes such as smelter, extrusion, rolling, conformation, powder metallurgy and machining, not being restricted to its geometry provided that it allows ionized gas access by the plasma to all extension of its surface, without the generation of electric arcs. In one embodiment, the component is composed of silicon or common steel or stainless steel or tool steel or highly bonded steels or tungsten and its alloys or aluminum and its alloys, the preferred composition being low carbon steel, because of its low cost.

The surface finishing of the component influences in the topography of it, which influences the process, thus, it is preferred to have components presenting topographies with lower number of valleys and low peak-to-valley ratios. However, this topography can be modified during the step of topographic modification, during the step of formation of the mechanical support (thermochemical treatment), or a sum of these modifications, so that it is important, but not a limitation of the process. In one embodiment, the components have a surface finish selected from the group of, machined, rectified in flat grinding, rectified in centerless grinding, rectified in universal cylindrical grinding, polished, rectified and polished, and the like. Or even components with a rough surface (without finishing process).

After placing the components in the support, the plasma reactor is closed, the pressure is reduced to medium vacuum, a plasma-activated gas flow is introduced via pulsed DC source (direct current) and heating of the reactor through the use of resistive electrical system.

In one embodiment, the components wherein the coating (carbon film) is deposited are placed in a suitable support, designed in a manner that assists homogeneous film deposition and allows the reverse polarity within the plasma reactor. In one embodiment, the process utilizes a tree-like support, which allows for the allocation of a large number of parts, thereby increasing process productivity.

The cleaning step can be carried out with positive polarization of the support and use of gases such as argon, hydrogen, nitrogen, oxygen or a combination thereof. The gas flow is defined according to the number of components and with the size of the reactor chamber. The working pressure is defined so that there are gaseous species sufficient to clean the surface of the components, but less than that necessary for electric arc closure and plasma disruption. It is recommended to use a pressure between 0.1 and 10 Torr throughout the whole cycle. such step can be carried out from 20° C. to 300° C., being preferably carried out during heating, without the need for temperature threshold.

The surface modification (topography) of the components occurs via bombardment of plasma ions through the polarization of the negatively charged support. The temperature of such step is between 200 and 650° C. The different topographic modifications, possible via plasma, depend basically on the working pressure, on the connected time of the plasma source and the type of gas used (ion size). Increased working pressure and/or connected time on the plasma source indicate that a greater number of species will be reaching the surface of the components for the same process time, which will lead to a more aggressive modification in the topography thereof, a higher applied voltage of the source increases the energy per ion, causing a similar effect. Also, a larger ion size has the same effect. In this manner, when performing the surface modification step with argon ions, a greater surface modification is expected than when such step is carried out with hydrogen ions. Among the possible gases to be used for such modification are: argon, hydrogen, nitrogen and oxygen.

The mentioned parameters have effects that interact with each other, thus, the surface topography of the component at the end of such step depends on the combination of these parameters of the cycle, besides the surface finishing of the component (pre-cycle), the hardness of the component material, and other subsequent steps that alter the topography of the component, thus, having a high number of possibilities of topographies to be generated. These different topographies will result in different adhesions of the carbon film to the part and influence the tribological performance of thereof.

Figure 4:
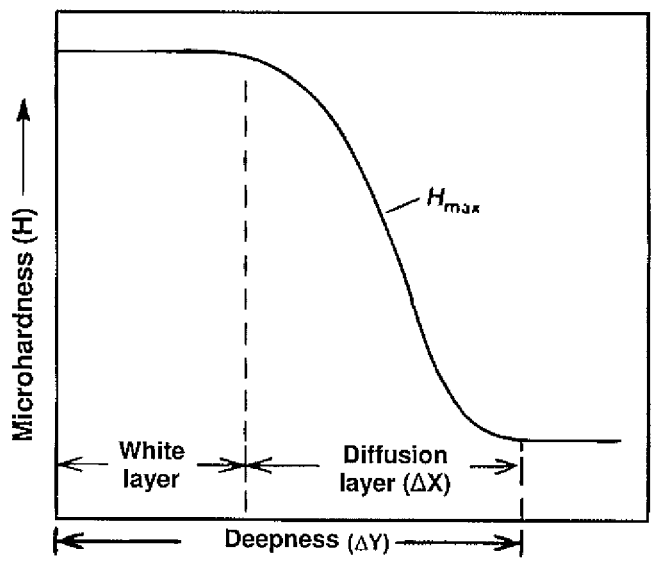
FIG. 4 illustrates a graphic of the ratio of the surface hardness of the substrate to the depth of the layers. Adapted from ASM International.

Said mechanical support layer is not necessarily continuous and compact. The changes are basically summarized in increasing wear resistance, fatigue, corrosion and gradual increase of the surface hardness of the substrate, to provide sufficient mechanical support to allow the expected tribological performance of the amorphous carbon film (FIG. 4). In addition, the formation of the mechanical support layer always implies in some topographic modification whose intensity depends on the type of layer formed and the processing parameters. Unlike other surface treatment processes, this thermochemical treatment does not cause matrix phase change throughout the process, nor does it require transformation through rapid cooling, this means reduction of dimensional distortions in treated components and generation of residual stresses. Among the advantages of such process are: low level of pollutant residues (compared to electrochemical coating treatments), reduced process time, facility in control of process variables, facility in automation and improved dimensional control.

In one embodiment, as well as modifying the topography, the thermochemical treatment can develop a mechanical support layer, which can be obtained through nitriding, cementation, boretation, carbonitriding, surface enrichment with elements such as molybdenum, among others. The restriction of the elements to be used to generate such mechanical support basically refers to the type of gas, target or precursor used that must be ionizable by the plasma so that the ions can be deposited in the part. such step is carried out in a temperature range higher than the topographic modification (usually between 250 and 650° C.) and the process parameters, namely, pressure, connected time of the plasma source, gas flow, gas type, are variable and defined according to the type of layer to be generated and the type of component (material) where the carbon film will be deposited.

Among the possible thermochemical treatments to be used for the creation of the mechanical support layer are: cementation, gaseous nitriding, salt bath nitriding, ionic nitriding, quenching, tempering, and the like. Any thermochemical process to form a mechanical support layer, whether or not ionic nitriding, causes changes in the topographic features of the surface of the treated parts, such as for example, the roughness. These changes will depend not only on the process to be used, but also on the intrinsic features of the substrate, prior to the treatment of mechanical support layer formation (raw, rectified, polished, machined substrate, and the like).

A feature of this treatment is the low energy associated to the ions, thus, unlike processes such as deposition assisted by ionic beam and immersion and implantation of plasma ions, does not implant ions in the component. In one embodiment, in such step may occur deposition of ions that subsequently diffuse into the material generating a region with diffused atoms which may harden the material by solid solution or formation of high hardness/precipitate phases, in which case no layer is generated, but this hardened region also provides mechanical support to the carbon film, which increases its resistance to displacement (diffusion layer). The deposition of the carbon film in the absence of a mechanical support layer is possible to be carried out, but it is known that a support layer provides better film properties, especially adhesion, and in this case, is usually the preferred solution.

After the topographic modification a chemical support layer is deposited, this being an interlayer, more preferably a chemical adhesion interlayer. Such step is governed by the same restrictions of the step of mechanical support layer deposition, in relation to the type of gas or precursor used, however it must be carried out in a lower temperature range (usually between 200 and 350° C.) otherwise it may occur the failure of this layer or degradation of the precursor, due to high temperatures. The cycle parameters depend on the type of gas or precursor used and the material (as well as on the mechanical support layer deposition step). For the formation of such layer, it is usually used connected source times between 75 and 90% of the time of a pulse of the DC source, which operates at a frequency of 50 to 150 kHz.

Subsequently, occurs the carbon film deposition, at a similar temperature (200 to 350° C.) of the chemical support layer deposition. Again, the deposition parameters and the gases depend on the type of layer to be obtained and the desired layer thickness. For the process of the present invention it is allowed the use of carbon precursor gases such as methane, acetylene, butane, cyclohexane, propane and the like, that is, the restriction of the gas to be used, once again, rests on the possibility of ionization thereof by the DC plasma source. It is known that by setting the deposition conditions (source parameters and plasma reactor) the use of two different gases, for example, methane and acetylene, leads to layers of different thicknesses; for the process described herein acetylene has a growth rate up to six (6) times greater than methane. The morphology and chemical composition of the layer are also altered, which in turn changes parameters such as hardness, adhesion and tribological performance of these layers. Although it has a higher thickness, the layer generated by acetylene gas, compared to methane, is a layer of lower hardness, lower adhesion and inferior tribological performance. However, since it has a high deposition and growth rate, a cycle carried out with acetylene in such step is faster than a cycle carried out with methane.

In one embodiment, the process described herein is carried out in a single cycle, without the need for opening of the plasma reactor, exchange of support or apparatus. The choice of the parameters of each step, as well as the choice of the realization or not of certain optional steps (mechanical support layer deposition) depends intrinsically on the type of film to be obtained and properties such as thickness, hardness, adhesion, durability in a tribological test, should be considered, but it is also necessary to evaluate the cost associated with each step and the complete cycle. The process described in the present patent, when carried out in its complete form (covering all steps) has a duration of approximately 8 hours. All cycles consider the reactor fully charged, totaling 600 components with a dimension of approximately 5 cm×2 cm×2 cm. In comparison with processes already known industrially, wherein the steps, namely, cleaning, mechanical support layer deposition, chemical support layer deposition and carbon layer deposition are carried out separately, that is, in different cycles, the total time of the process is similar or greater than 8 hours for forming layers with thicknesses similar to those of said process.

In a first object, the present invention provides a process for coating a conductive component, wherein the conductive component is in contact with a support capable of undergoing polarity inversions, within a plasma reactor, comprising the steps of:

a) Cleaning of the surface of the conductive component by electron bombardment, wherein the gases in the plasma atmosphere are selected from the group consisting of hydrogen, oxygen, argon, nitrogen or a combination thereof, in a temperature range between 20 and 300° C. and a working pressure between 0.1 and 10 Torr, with positive potential support;

b) Mechanical support deposition in the conductive component comprising gas ion bombardment selected from a combination of two or more gases of the group: hydrogen, oxygen, argon, nitrogen, methane, acetylene, or other ionizable hydrocarbon gas, in a temperature range between 200 and 650° C., working pressure between 0.1 and 10 Torr and voltage between −200 and −1000 V applied to the conductor component support;

c) Topographic modification comprising gas ion bombardment selected from a combination of two or more gases of the group: hydrogen, oxygen, argon, nitrogen, methane, acetylene, or other ionizable hydrocarbon gas, in a temperature range between 200 and 650° C., working pressure between 0.1 and 10 Torr and voltage between −200 and −1000 V applied to the conductor component support;

d) Deposition of the chemical support layer in the conducting component, by gas ion bombardment, wherein the gases are selected from the group consisting of gaseous or liquid precursors, containing elements with chemical affinity with the carbon, in a temperature range between 200 and 350° C., working pressure between 0.1 and 10 Torr, connected time of the plasma source between 75 and 90% of the time of a DC source pulse, which operates at a frequency of 50 to 150 kHz, and voltage between −300 and −1000 V applied to the conductor component support;

e) Deposition of amorphous carbon layer on the surface of the chemical support layer by gaseous hydrocarbon ions bombardment, wherein the gases in the plasma atmosphere are selected from the group consisting of at least one liquid precursor with at least one metal radical or the combination of such precursor with at least one ionizable hydrocarbon gas and generating ions which are deposited on the component, in a temperature range of 200 to 350° C., working pressure between 1 and 3 Torr, connected time of the plasma source between 75 and 90% of the time of a DC source pulse, which operates at a frequency of 50 to 150 kHz and voltage between −300 and −1000 V applied to the conductive component support.

In one embodiment, the gases of step d) are of a group consisting of at least one liquid precursor with at least one metal radical or the combination of such precursor with at least one ionizable hydrocarbon gas and generating ions that are deposited in component.

In one embodiment, the process for coating a conductive component occurs in a single cycle.

In one embodiment, step b) comprises:
the formation of at least one mechanical support layer, by nitriding, cementation, carbonitriding, boreeting; or
the formation of at least one superficial enrichment diffusion layer with matrix hardening elements of the conductive component; or
a combination thereof.

In one embodiment, step c) occurs prior to the formation of the mechanical support (step b)) or after the formation of the mechanical support layer, or in conjunction with the step of chemical support layer deposition (step d));

In a second object, the present invention features a conductive component coating, produced by said process for coating a conductive component, wherein the coating comprises:

at least a first mechanical support layer, in direct contact with the surface of the conductive component;

at least one chemical support layer, between the mechanical support layer and an amorphous carbon layer;

at least one amorphous carbon layer adhered to the chemical support layer.

In one embodiment, the conductive component coating comprises a diffusion layer on the surface of the conductive component.

In one embodiment, the conductive component coating comprises:

at least one diffusion layer of 250 to 300 µm of thickness on the surface of the conductive component;

at least one mechanical support layer of 10 µm of thickness, composed of nitrides in direct contact with the surface of the conductive component;

at least one chemical support layer, between the mechanical support layer and an amorphous carbon layer;

at least one layer of amorphous carbon.

In one embodiment, the chemical support layer is composed of silicon, carbon and hydrogen and is 1.2 µm of thickness. In one embodiment, the chemical support layer enhances the adhesion of the amorphous carbon layer.

In one embodiment, the coated component is self-lubricating. In one embodiment, the self-lubricating coated component is used in a bearing system, such as, a bearing system in compressors.

In one embodiment, the process described herein is proposed as invention enables all of these steps, which are usually carried out separately, to be carried out in a single cycle without the need for reactor opening, exchange of support or apparatus. This is only possible with the combination of six main features of the present invention.

The first feature involves the realization of all steps via plasma in a closed reactor, with controlled atmosphere, with the possibility of changing the parameters such as temperature, pressure, connected time of the plasma source, voltage, gas flow, gas type and polarization of the support, where the parts are located, changing it from positive (cleaning step) to negative (in later steps).

The second feature involves the proper design of the support, to allow such polarization exchange without affecting the components or generating plasma edge effects (heterogeneities near the ends of the parts as live corners) in the regions of interest of the component and which maintains the plasma stable and homogeneous in all parts. In addition to the polarization exchange of the second support present in the chamber (without contact with the conductive components) to stabilize the process via plasma.

The third feature involves the non-exposure of the components to the environment or undesired atmospheres, exposure that causes the inherent contamination of the component surface of interest, wherein the carbon film (or even mechanical support layer and chemical support layer) is deposited and, therefore, introduces additional cleaning steps between the other steps. This non-exposure is only possible due to the single cycle, so that the component is cleaned only once, at the beginning of the cycle, and leaves the reactor with the carbon film and optional layers, when desired, deposited, stable and without contamination that could negatively influence the performance regarding the adhesion and tribology.

The fourth feature involves the superficial modification (topographic) carried out by plasma (with specific parameters for each material and initial superficial feature of the component) and allowing the deposition of the amorphous carbon film, with crucial improvement in the tribological performance of the components due to the topographic modification.

The fifth feature involves the ability to introduce, into the plasma reactor, gases (gaseous precursors) and, also, liquid precursors which upon evaporation can be ionized by the plasma, similarly to an element which is introduced into the process already in the form of gas.

The sixth feature involves the knowledge of the parameters (gas type, gas flow, gas content, temperature, pressure, connected time of the plasma source and voltage) relative and specific to each step, to obtain a strict control of each step and ensuring the deposition of a multi-layered system with compositions and features known, in the desired thicknesses and in a specific order.

The process allows, thus, the production of large series of equal parts, in high productivity and with controlled parameters.

In one embodiment, the present invention allows the production of self-lubricating components, in a single cycle, composed of several steps: efficient cleaning, construction of a suitable topography and which favors the adhesion of the layers subsequently deposited, formation of the mechanical support layer and chemical support layer and the amorphous carbon film deposition. Each step has a specific function, but they are all carried out subsequently in a plasma reactor, thus, enabling large scale production and with reproducibility of components containing a self-lubricating carbon film which facilitates its industrial implementation and its broad application in the market.

In one embodiment, the present invention provides a process for obtaining these components without the need for additional operations and carried out within the same equipment in a single cycle. In this way, the loading of the plasma reactor occurs only once, before the start of the cleaning process and at the end of the cycle the components contain the self-lubricating carbon film. Tests carried out indicate that the process of the present invention presents a lower cost than conventional processes combining three processes: cleaning, mechanical support layer deposition and chemical adhesion and DLC deposition via plasma. In addition, the components produced in a single cycle present tribological performance and adhesion superior to those previously mentioned. The process allows the production of large series of equal parts, in high productivity and with controlled parameters.

In the present document the term "plasma reactor" is understood as any apparatus capable of generating a plasma atmosphere.

It is understood herein that a suitable support for the conductor is a support which does not generate undesired edge effects and allows reversal of polarity.

Examples—Embodiments

Example of Mechanical Support Deposition

For the generation of a layer composed of nitrides of approximately 10 µm of thickness with a diffusion layer immediately below it, with a thickness between 250 and 300 µm on common SAE 1020 steel, the following parameters were used: pulsed negative voltage of 400V, connected time of the plasma source of 75% at a frequency of 50 kHz, pressure of 2 Torr, temperature of 550° C., gas mixture composed of nitrogen (90%), hydrogen (9%) and methane (1%), gas flow of 1000 sccm and deposition hold time of 90 minutes.

Example of Chemical Support Deposition

For generation of a chemical support layer the chosen liquid precursor was Hexamethyldisiloxane. Through the pressure difference between the Hexamethyldisiloxane reservoir, located outside the plasma reactor, and the reactor chamber this was evaporated, introduced into the chamber and ionized by the plasma. In this case, the deposition of a chemical adhesion layer containing silicon, hydrogen and carbon occurred. For the deposition of a chemical adhesion layer with a thickness of approximately 1.2 µm on a non-polished, rectified SAE 1020 steel component that underwent a light topographic modification and had a mechanical support layer, the following parameters were used: voltage 500V (negative), connected time of the plasma source of 75% at a frequency of 50 kHz, pressure of 1 Torr, temperature of 250° C., hydrogen gas (30%), argon (30%), methane (38%) and hexamethyldisiloxane (2%), gas flow rate of 1000 sccm, and deposition time of 35 minutes.

The invention claimed is:

1. A process for coating a conductive component, wherein the conductive component is in contact with a support, and configured to undergo polarity inversions within a plasma reactor, comprising the steps of:
    a) Cleaning of a surface of the conductive component by electron bombardment, wherein the gases in the plasma atmosphere are selected from the group consisting of hydrogen, oxygen, argon, nitrogen or a combination thereof, in a temperature range between 20 and 300° C. and a working pressure between 0.1 and 10 Torr, with positive potential support;
    b) Deposition of a mechanical support in the conductive component comprising gas ion bombardment selected from a combination of two or more gases of the group: hydrogen, oxygen, argon, nitrogen, methane, acetylene, or other ionizable hydrocarbon gas, in a temperature range between 200 and 650° C., working pressure between 0.1 and 10 Torr and voltage between −200 and −1000 V applied to the conductor component support;
    c) Topographic modification comprising gas ion bombardment selected from a combination of two or more gases of the group: hydrogen, oxygen, argon, nitrogen, methane, acetylene, or other ionizable hydrocarbon gas, in a temperature range between 200 and 650° C., working pressure between 0.1 and 10 Torr and voltage between −200 and −1000 V applied to the conductor component support;
    d) Deposition of the chemical support layer in the conducting component, by gas ion bombardment, wherein the gases are selected from the group consisting of gaseous or liquid precursors, containing elements with chemical affinity with the carbon, in a temperature range between 200 and 350° C., working pressure between 0.1 and 10 Torr, connected time of the plasma source between 75 and 90% of the time of a DC source pulse, which operates at a frequency of 50 to 150 kHz, and voltage between −300 and −1000 V applied to the conductor component support;
    e) Deposition of amorphous carbon layer on the surface of the chemical support layer by gaseous hydrocarbon ions bombardment, wherein the gases in the plasma atmosphere are selected from the group consisting of at least one liquid precursor with at least one metal radical or the combination of such precursor with at least one ionizable hydrocarbon gas and generating ions which are deposited on the component, in a temperature range of 200 to 350° C., working pressure between 1 and 3 Torr, connected time of the plasma source between 75 and 90% of the time of a DC source pulse, which operates at a frequency of 50 to 150 kHz and voltage between −300 and −1000 V applied to the conductive component support;
    wherein, in step d), (i) a gas mixture of hydrogen (30%), argon (30%), methane (38%) and hexamethyldisiloxane (2%) is used, (ii) hexamethyldisiloxane is the liquid precursor, and (iii) the gas mixture flow is 1000 sccm (cm$^3$/min) and the deposition time is 35 minutes.

2. The process according to claim 1, characterized in that the coating process occurs in a single cycle.

3. The process according to claim 1, characterized in that step b) comprises:
    the formation of at least one mechanical support layer, by nitriding, cementation, carbonitriding, boreeting; or
    the formation of at least one superficial enrichment diffusion layer with matrix hardening elements of the conductive component; or
    a combination thereof.

* * * * *